United States Patent [19]

Carr

[11] 4,328,401
[45] May 4, 1982

[54] METER TEST SWITCH

[75] Inventor: John M. Carr, Fort Washington, Pa.

[73] Assignee: The Eastern Specialty Company, Philadelphia, Pa.

[21] Appl. No.: 132,203

[22] Filed: Mar. 20, 1980

[51] Int. Cl.³ ............................................. H01H 21/22
[52] U.S. Cl. ................................. 200/11 R; 200/50 C;
200/153 M; 200/252; 324/73 R; 361/368
[58] Field of Search ............. 200/164 R, 164 A, 11 R,
200/11 A, 11 B, 11 C, 11 D, 11 DA, 11 E, 11
EA, 11 G, 11 H, 11 J, 11 K, 11 TC, 11 TW, 50
C, 46, 153 M, 16 F, 162, 252, 260; 324/73 R, 58
R; 361/364, 366, 368

[56] References Cited

U.S. PATENT DOCUMENTS

| 992,539 | 5/1911 | Blokusewski | 324/74 |
|---|---|---|---|
| 1,149,312 | 8/1915 | Webster | 200/155 |
| 1,610,676 | 12/1926 | Hart | 200/155 |
| 1,822,113 | 9/1931 | Schramm | 200/50 B |
| 1,834,184 | 12/1931 | Schramm | 200/51.1 |
| 1,987,564 | 1/1935 | Owens | 324/74 |
| 2,260,350 | 10/1941 | Stout et al. | 200/4 |
| 2,452,747 | 11/1948 | Gomez | 200/43 |
| 2,466,072 | 4/1949 | Batcheller | 200/155 |
| 3,174,000 | 3/1965 | Golbeck | 200/16 F |
| 3,202,775 | 8/1965 | Tillson | 200/6 |
| 3,238,319 | 3/1966 | Godel et al. | 200/11 |
| 3,313,904 | 4/1967 | Chambaut | 200/283 |
| 3,497,643 | 2/1970 | Heath | 200/6 |
| 3,525,825 | 8/1970 | Allison | 200/11 |
| 3,548,123 | 12/1970 | Allison | 200/11 |
| 3,617,670 | 11/1971 | Linderfelt | 200/153 |
| 3,715,543 | 2/1973 | Keto et al. | 200/155 R X |
| 3,858,021 | 12/1974 | Brandeis | 200/164 |
| 3,917,920 | 11/1975 | Pekrul et al. | 200/162 |
| 4,031,345 | 6/1977 | Garcia | 200/67 AA |
| 4,086,548 | 4/1978 | Robbins et al. | 333/81 |
| 4,096,365 | 6/1978 | Hodell | 200/11 DA |
| 4,133,990 | 1/1979 | Wanner et al. | 200/6 B |

FOREIGN PATENT DOCUMENTS

| 2152128 | 4/1973 | Fed. Rep. of Germany. | |
| 2440550 | 8/1974 | Fed. Rep. of Germany | 200/254 |
| 309007 | 8/1955 | Switzerland. | |
| 955052 | 4/1964 | United Kingdom. | |

Primary Examiner—J. V. Truhe
Assistant Examiner—Morris Ginsburg
Attorney, Agent, or Firm—Seidel, Gonda, Goldhammer, Panitch

[57] ABSTRACT

An electrical test switch having a pair of spaced conductive rotors provided with matching cut-outs, the rotors being movable between a "normal" position and a "test" position. At least two spaced conductive contacts extend within a region between the rotors. The cut-outs and the conductive contacts are arranged so that the contacts wipe against the rotors when the rotors are in the "normal" position and at least one of the spaced contacts is aligned with the cut-outs when the rotors are in the "test" position. A shaft locks the switch in the "normal" position until manually released.

26 Claims, 13 Drawing Figures

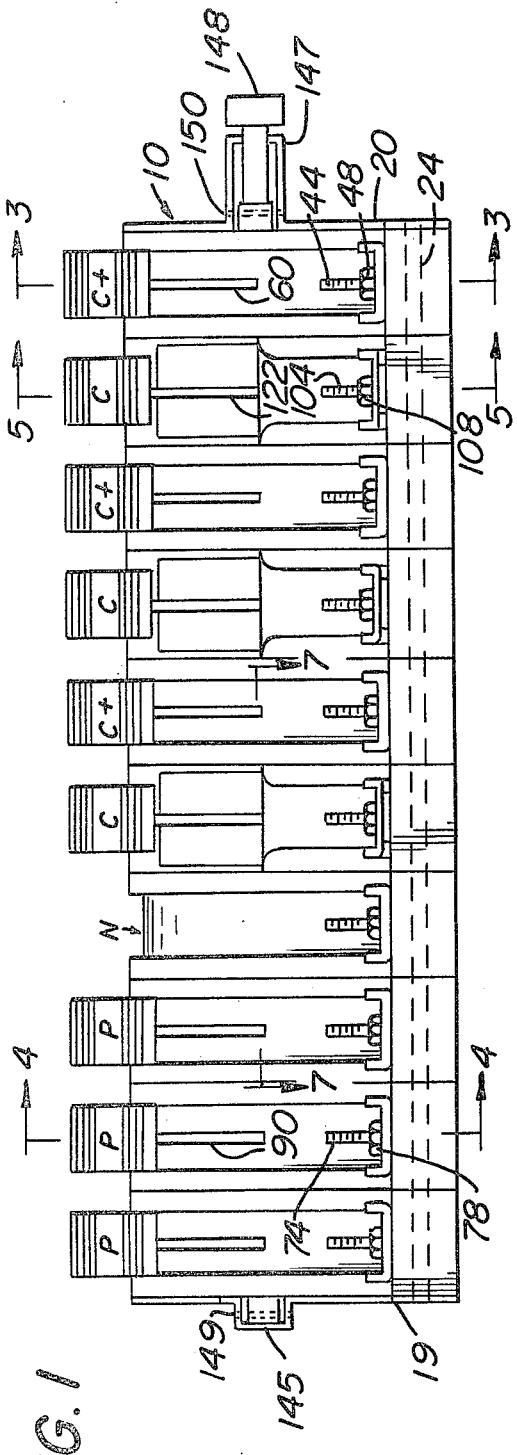
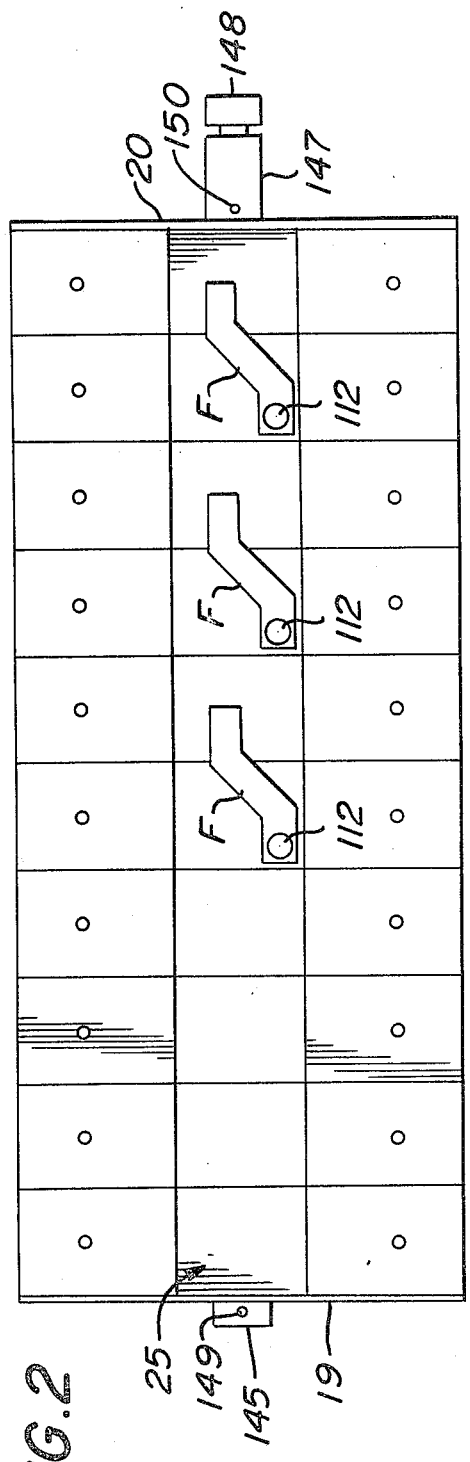
FIG. 1
FIG. 2

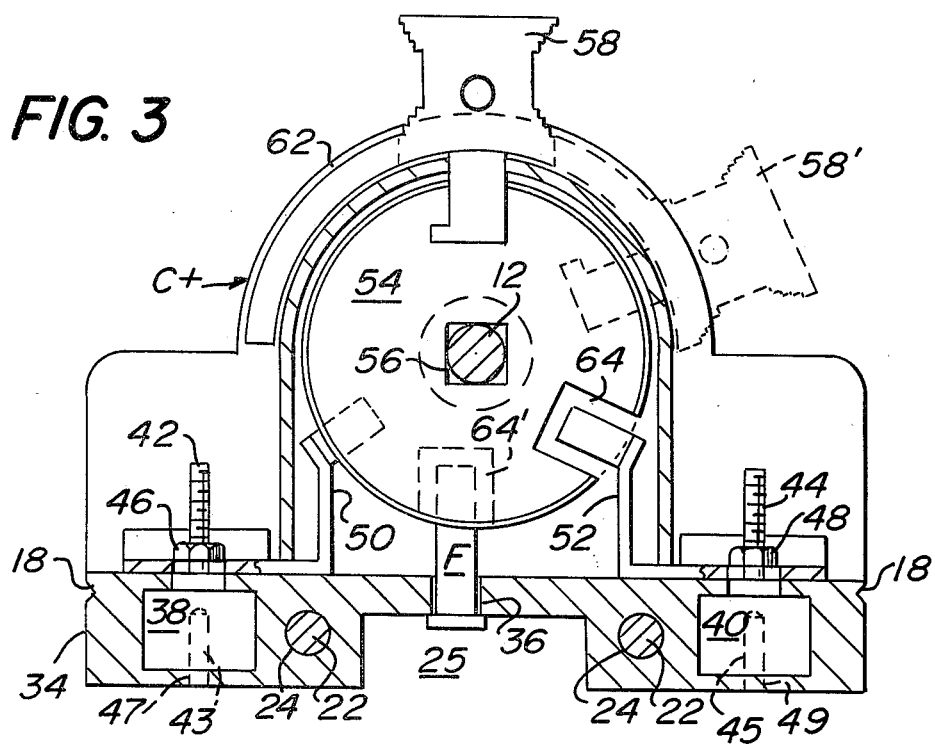
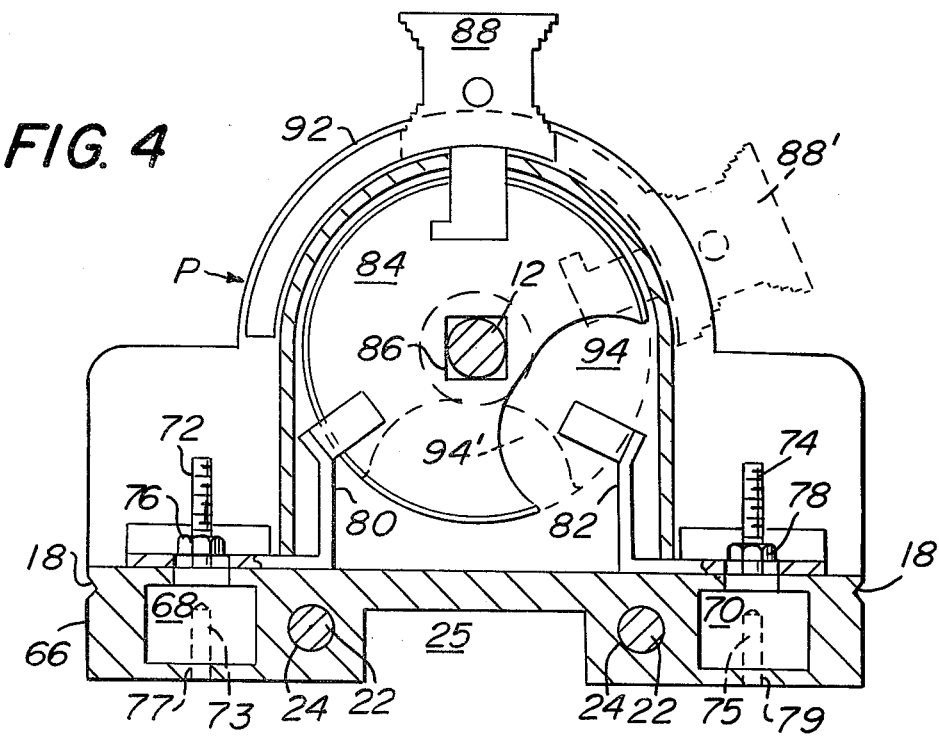

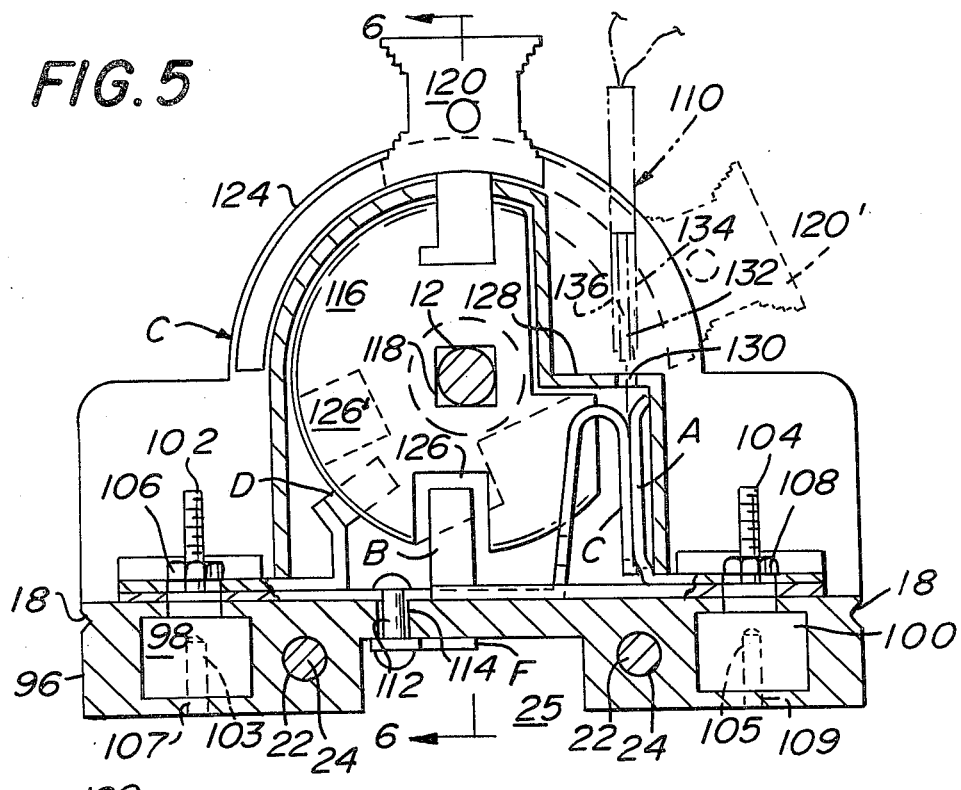
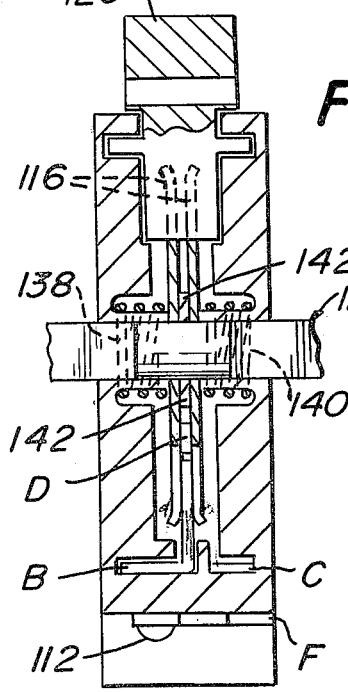

METER TEST SWITCH

BACKGROUND OF THE INVENTION

Meter test switches, such as watthour meter test switches, are well known in the electric utility industry. Such switches operate in conjunction with other test instruments, such as ammeters, which must be inserted into the watthour meter circuit without interrupting current flow. Various switch designs have been proposed by different manufacturers. These designs, however, have certain undesirable features which the present invention eliminates.

Existing test switches of the type used for measuring current in a transformer rated kilowatthour meter use knife blade type switch sections for opening and bypassing circuits. Three different types of sections are used to provide the required test functions. These sections are generally referred to as potential (P), current test (C) and current shunt (C+) switches, like terminology being adopted hereinafter.

The P switch is an SPST switch having a threaded terminal post electrically connected to a yoke on which the knife blade pivots. To conduct current, the blade is pivoted to a position where it slides between a laterally expanding pressure contact which is electrically connected to a second threaded terminal post. The C+ switch is an SPDT switch having an electrical contact configuration similar to the P switch and a laterally expanding yoke provided with a retaining finger for limiting upward movement of the blade. The yoke of the C+ switch is connected electrically to the C switch so that current is shunted from the C+ switch to the C switch when the blade of the C+ switch is in the partially raised position contacting the yoke. The blade of the C+ switch, however, does not contact the yoke in its normally conductive position. The C switch is also similar to the P switch with the addition of a shunt connection from one of its terminals to the yoke of the C+ switch and abutting laterally expanding spring-type contacts for the insertion of a two-conductor test instrument probe. The spring contacts are so situated that the blade of the C switch does not make contact with them in any position.

Sets of the above described switches are mounted conventionally on a non-conducting base which is covered by a plastic cover when the switches are not in the "test" position. The three types of switches, P, C and C+, can be arranged in any configuration so as to satisfy the immediate needs of the user for a specific application. For example, three sets of the above-described switches and a neutral strap can be arranged on a base to measure current in a kilowatthour meter for a three-phase electrical system. However, once mounted on the base, the switches cannot be easily interchanged.

In any application, the knife blade design of the conventional test switch requires the use of multiple laterally expanding pressure connections. Due to the frequency with which the switches are opened and closed in normal use, the resistance of the contacts can vary considerably. This may result in incorrect metering or excessive heating, which could ultimately lead to destruction of the switch. When the switch is in use, with the plastic cover removed, the switch is exposed directly to the environment posing a potential hazard to the user.

The test switches suffer from other deficiencies as well. For example, the switch contacts must exhibit an extremely low, but relatively constant resistance. Yet, due to manufacturing tolerances in aligning the contacts, varying resistances often result. The resistance of each switch may also vary due to exposure of the switch to the environment. Tampering with the switches can also occur since the cover is easily removable. For example, an insulating tape can be placed over the knife blade to prevent electrical connection. This would result in an incorrect and/or lower watt hour meter reading. The current transformer core can become saturated. When saturated the voltage in the transformer coil is greatly increased which could cause the insulation in the core to break down and disintegrate causing the coil to short circuit or burn out.

Any combination of the above factors could also cause excessive heating of the switch which could warp or destroy such switch. Since the switches are mounted on a molded insulating type base, where the base constitutes the only support and alignment for the switch elements, replacement of a single switch due to malfunction or destruction while the switch is in use is impracticable without replacing the entire switch assembly.

The heating of the switch elements due to the variances in resistance can also affect the base and cause it to warp or fracture when bolted to a flat surface such as a metal plate thus requiring the replacement of the entire assembly.

The plastic cover acts as a locking mechanism for the switches because it can only be mounted on the base when all switches are in their "normal" or conducting position. This provides a check for returning the switches to their conducting position. However, the cover can be lost or damaged due to its detachability and no longer provide this check. Also, in the "test" mode, the cover is removed exposing personnel to high voltages across the contacts of the switches.

The test switches currently in use are operated in such a manner as to temporarily short-out a current transformer secondary winding so as to prevent damage to the current transformer while a calibrated current is inserted from test sources into the watthour meter current circuit. In addition the switches can be operated so that the current to the kilowatthour meter can be sampled by the insertion of a test probe into the meter test switch circuit without the necessity of breaking the circuit for each test.

SUMMARY OF THE INVENTION

The present invention is directed to a substantially different type of switch which performs the same or similar functions as the test switch already described but in a much more reliable and safe manner. The switch of the present invention reduces the number of pressure contacts to the minimum necessary and provides low contact resistance with minimal deviations. Each switch section includes two (or three) fixed conductive contacts and a pair of rotatable disks which provide a conductive bridge between the fixed contacts. Each switch section is aligned on a shaft made of insulative material having alternate square and round sections. Any number of switch sections necessary for a specific application may be strung on the same shaft and snap-fitted into an insulating base. The shaft is designed with alternating square and round portions so that the disks may be locked in the conducting position by moving the square portion of the shaft into alignment with the square center opening of the disks or allowed to freely rotate by moving the round portion of the shaft into alignment with the square center of the disks.

Rotation of the disks is controlled by a handle extending outward through a slot in the upper portion of the switch housing. When the disk is rotated to the conducting position, a tail, attached to the handle, seals the slot and protects the internal components of the switch from the environment.

Each rotatable disk is under a constant spring pressure forcing the disk inwardly against a spacing insulator. The space between the disks is sufficient to provide constant contact between the disks and the fixed contacts within the switch housing, producing a constant contact resistance. The rotating action of the disks also continually cleans the contacting surfaces by providing a wiping action. In addition, by the pair of disks contacting opposite sides of the fixed contact, an equivalent circuit of two low resistances in parallel results which further reduces the total resistence across the switch section.

Due to the enclosure of all of the conducting elements within the switch housing, the danger to service personnel of touching one of the high voltage contacts has been eliminated. It is also unnecessary to provide a cover for the entire switch assembly because each switch section is enclosed in its own housing. The switch sections are easy to install and, if necessary, replace due to the snap-fit between the housing and the base.

The individual switch sections are inserted in the base. Two tie rods which extend through the individual switch sections hold them in side by side relationship for insertion into the base. This type of assembly allows for easy repairing of defective switch sections in the field by unsnapping the switch assembly from the base, removing the tie rods and shaft from the switch sections, replacing the defective switch sections, reassembling the parts and inserting the switch assembly into the base. In addition, switch assemblies of this type can be sold as individual sections or as complete assemblies. This makes the test switch assembly of the present invention more attractive, especially in foreign markets, as it may be assembled easily on site, reducing import taxes and duties.

BRIEF DESCRIPTION OF THE DRAWINGS

For the purpose of illustrating the invention, there is shown in the drawings a form which is presently preferred, it being understood, however, that this invention is not limited to the precise arrangements and instrumentalities shown.

FIG. 1 is a front elevation view of the test switch assembly.

FIG. 2 is a bottom plan view of the test switch assembly with the base removed.

FIG. 3 is a cross-section of a C+ switch section taken along the lines 3—3 of FIG. 1.

FIG. 4 is a cross-section of a P switch section taken along the lines 4—4 of FIG. 1.

FIG. 5 is a cross-section of a C switch section taken along the lines 5—5 of FIG. 1.

FIG. 6 is a cross-section of a C switch section taken along the lines 6—6 of FIG. 5.

FIG. 8 is a perspective view of the central shaft.

DETAILED DESCRIPTION OF THE INVENTION

Figure 13:
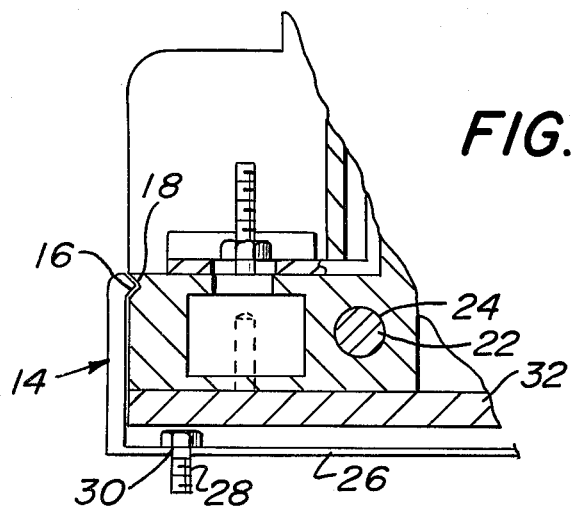
FIG. 13 is a partial cross-section of a switch section showing the snap-fit between the base and the switch section.

Referring to the drawings, wherein like numerals indicate like elements, there is shown in FIG. 1 a test switch assembly 10 in accordance with the invention. The assembly 10 includes switch sections identified by lettering. The three switch sections at the leftmost portion of the test switch are potential switches, designated P. The next space to the right of the P switches is a neutral strap, designated N. The switch section in the next position is a current test switch, designated C. In the next position is a current shunt switch, designated C+. The remaining four positions to the right contain, in this specific arrangement, alternating C and C+ switch sections. Other arrangements of switch sections are possible, the arrangement shown in FIG. 1 being exemplary only. A shaft 12 extends through each test switch section. The base 14 is adapted to receive each switch section in a snap-fit as shown in FIG. 13. A rib 16 formed on the interior of opposing side walls of the base fits into a mating notch 18 on opposite ends of each switch section. The base 14 is held onto a flat surface by means of screws or bolts 28 which pass through holes 30 in the bottom 26 of base 14. An insulating pad 32 of non conducting material fills the space between the bottom of the switch sections and the base 14 to prevent shorting of any connections on the underside of the switch sections to the bolts 28. This is because each section can be adapted to be backwired using threaded post holes exposed through the bottom of each switch section.

The assembly 10 also includes end sections 19, 20 which are adapted to snap-fit into the base in the same manner as the intervening switch sections. See FIG. 2. The end sections 19, 20 extend farther downward toward the bottom 26 of base 14 to retain the pad 32 in place. The sections 19, 20 also maintain the switch sections in alignment on a pair of threaded tie rods 22 which extend through spaced holes 24 formed in each of the switch sections and the end sections 19, 20. Retaining nuts (not shown) on each end of the tie rods 22, are used to maintain inward pressure on the switch sections to keep each of the sections in alignment.

Figure 11:
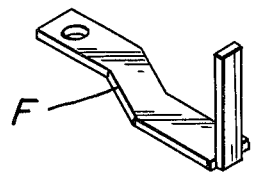
FIG. 11 is a perspective view of an F-type shunting contact.

The interconnection of a C switch section and a C+ switch section is shown in FIG. 2. This interconnection takes the form of a metal strip F, as shown in FIG. 11. One end is inserted through the bottom of the C+ switch section with the other end connected to the C switch section by means of a rivet 112.

Figure 9:
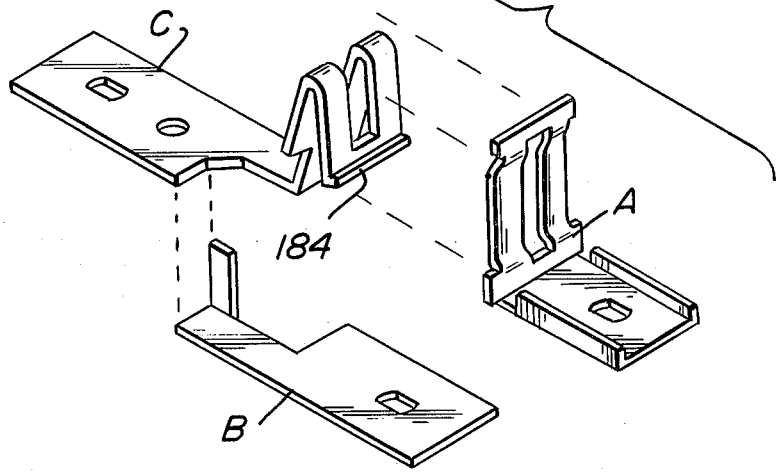
FIG. 9 is an exploded view of the fixed contacts in a C switch section.
Figure 10:
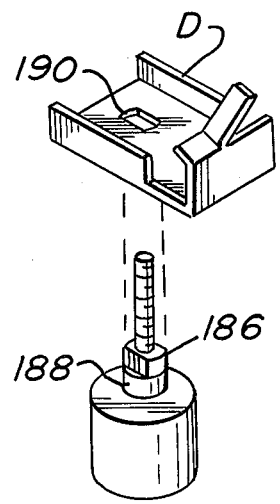
FIG. 10 is a perspective view of a D-type fixed contact mounting over a connection post.

The C+ switch, as shown in FIG. 3, has a base 34 of insulating type material. The notches 18 appear on each external side of the switch and run the entire width. The base also has two holes 24 to accomodate the tie rods 22 discussed above. Inserted through the base is the shunt strap F with its associated vertical fixed contact extending upward into the switch body through an opening 36. On either side of the switch there are two electrical connections 38, 40 each having a threaded post 42, 44, a retaining nut 46, 48, and internally threaded holes 43, 45. The threaded holes 43, 45 are used for mounting threaded posts (not shown) for electrically connecting the switch section from the back. The threaded posts would extend out from connections 38, 40 through holes 47, 49 in base 34. The nuts 46, 48 are used to electrically connect the posts 42, 44 to external wires for connection to the power source or load. The fixed contacts 50, 52 have a D-type configuration, as shown in FIG. 10, and are electrically connected to the posts 42, 44 by staking. The contacts shown in FIGS. 9 and 10 for use with the switch sections of this invention have double-D type holes in their base portions for fitting over the upright connection posts of the switch sections. Each contact is placed over the posts and fit down onto the double-D mating structure 186 on the connection. The bottom of the contact is flush against the collar 188. The mating structure 186, once the contact is in place, is mechanically compressed into the space remaining between the structure 186 and inwardly sloping sides of hole 190. The double-D hole in the contacts together with the staking maintain sufficient pressure between the posts and the contacts to keep the contacts in good electrical connection with the posts.

The contacts 50, 52 extend upward and angularly toward the center of the switch. All of the fixed contacts, F, 50 and 52 are engageable with the rotor disks 54. The disks 54 have a square center hole 56 through which the shaft 12 extends. Each disk 54 is rotated by a handle 58 which is attached to both disks. In rotating the disks 54 the handle 58 travels through a slot 60. In order to seal the interior elements of the switch section from the environment a tail 62 is attached to the handle 58. As the handle 58 is rotated to the "normal" position, the tail 62 covers the slot 60 protecting the interior of the switch from the environment, preventing dust and small particulate matter from getting inside the switch.

The disks 54 have matching substantially rectangular cut-outs 64. These cut-outs 64 are so situated on the disk so as to either engage or isolate one of the fixed contacts.

The switch, shown in phantom in its "normal" conductive position in FIG. 3, will conduct current from the terminal connection 38 through contact 50 to the disks 54. No current will flow through the contact F because the cut-outs 64 leave it isolated. The rotor 54 will conduct the current to contact 52 and to terminal connection 40. In the "test" position, shown in solid lines with the handle 58 in a vertical position, contact 52 will be isolated. Thus no current will flow through the switch to the output terminal 40. Contact F will be electrically connected through the disks 54 to contact 50 and in turn to input terminal connection 38. Contact F is also shunted to the current test switch C which function will be explained below.

Shown in FIG. 4 is a switch section generally designated P. This potential switch P greatly resembles the C+ switch in its configuration. The P switch has a similar type insulating base 66 with notches 18 on both sides running the entire width of the switch. The tie rods 22 also extend through the base of the P switch through holes 24. The P switch has two electrical connections 68 and 70, each having a threaded post 72, 74, a retaining nut 76, 78 for connecting to external wiring and internally threaded holes 73, 75. The threaded holes 73, 75 are used for mounting threaded posts (not shown) for electrically connecting the switch section from the back. The threaded posts would extend out from connections 68, 70 through holes 77, 79 in base 66. Extending into the interior of the P switch from the terminal 68 is a D-type contact 80. Similarly extending into the interior of the P switch from the terminal 70 is another D-type contact 82. Both contacts 80, 82 are connected to the terminals 68, 70 by staking as described above. The P switch also has two flat plates or disks 84 which are rotatable about the common shaft 12. The disks have a square center hole 86 through which the shaft 12 extends. A handle 88 controls the angular motion of the disks 84 and rotates the disks 84 forward through a slot 90. Attached to the rear portion of the handle 88 is a tail 92 which seals the slot when the handle 88 is rotated in the "normal" position to prevent dust or small particulate matter from entering the interior of the switch housing.

The switching function is again controlled by the rotation of the disks 84 and the cut-outs 94. The cut-outs 94, as in the C+ switch, either isolate or make connection between the rotor and a fixed contact. Because the chance of arcing is much greater in a potential-type switch than in a current-type switch the cut-outs 94 are larger and arcuate in shape in the P switch. In the phantom position the rotor is in its "normal" conducting position and will electrically conduct from the fixed contact 80 to the fixed contact 82. When rotated to the "test" position, shown with the handle 88 in a vertical position, the cut-out 94 of the rotor disk 84 will isolate the fixed contact 82 opening the circuit.

The C switch, as shown in FIG. 5, has been modified from the configuration of the C+ switch shown in FIG. 3 to accept a current test probe. The C switch has a similar type insulating base 96 with notches 18 running the entire depth of both sides of the switch. Tie rods 22 also extend through holes 24 in the C switch base 96. On either side of the switch housing there are similar terminals 98, 100 with threaded posts 102, 104, retaining nuts 106, 108 for connecting to external wiring, and internally threaded holes 103, 105. The threaded holes 103, 105 are used for mounting threaded posts (not shown) for electrically connecting the switch section from the back. The threaded posts would extend out from connections 98, 100 through holes 107, 109 in base 96. All of the contacts to be described in relation to the C switch are staked over the posts 102, 104 to hold them in continuous electrical contact with the terminals 98, 100. Extending into the switch housing from the terminal 98 is a fixed contact D which extends upwardly and angularly toward the center of the switch. Also extending into the switch housing from terminal 98 is a spring contact C. Contact C abuts fixed contact A which extends into the switch housing from the opposite terminal 100. The contact C is configured so that it can spring away from contact A when a current probe 110 is inserted between them. Also extending into the switch housing from terminal 100 is a contact B. FIG. 9 shows an exploded view of the contact configuration of the C switch. The A contact overlays and is in electrical connection with the B contact. As shown in FIG. 5, the D contact overlays and is in electrical connection with the C contact. Referring again to FIG. 5, the F contact is electrically connected to the C contact by means of a rivet 112 which extends through an opening 114 between the interior of the switch housing and a channel 25 in the base 96.

The C switch has a pair of flat plates or disks 116 which are rotatably movable around the shaft 12. The center portion of the rotor disks 116 of the C switch have a similar square center hole 118 through which the shaft 12 extends. A handle 120 is connected to the rotor disks 116 and is movable through a slot 122. Attached to the rear portion of the handle 120 is a tail 124 which seals the slot when the handle 120 is rotated to the "normal" position to protect the internal elements of the switch from the environment, particularly from dust and other small particulate matter. The rotor disks 116 of the C switch have similar cut-outs 126 to the substantially rectangular cut-outs 64 in the C+ switch. In addition, the rotor disks 116 have a portion removed to match the step 128 so that the rotary disks 116 are concealed within the switch housing when in the "test" position.

Shown in phantom is the "normal" position of the rotor disks 116. In the "normal" position the disks 116 conduct current from the fixed contact D to the fixed contact B. When the disks 116 are rotated to the "test" position, shown with the handle 120 in a vertical position, contact B is isolated and no current is conducted through the disks 116. However, current can flow from the C+ switch through the shunt F back through the terminal connection 98 or through the abutting C and A contacts. With the rotor disks 116 and handle 120 in the "test" position, the current test probe 110 can be inserted through an opening 130 in the step 128. The probe 110 consists of a flat non-conducting spacer portion 132 which separates conductors 134, 136. The conductors are insulated from each other and are mounted on opposite sides of the non-conducting spacer 132. Each of these conductors 134, 136 is connected through a wire to a test instrument. Contacts C and A are designed such that when test probe 110 is inserted there exists a make-before-break electrical connection between contacts C, A and conductors 134, 136 as more fully described hereinafter.

The configuration of the disks 116 on the shaft 12 is shown in FIG. 6 and is exemplary of the interior mounting of the other switch sections. Springs 138, 140 presses the disks 116 inwardly against an insulating spacer 142. The peripheral region between the disks 116 is sufficient to accommodate the passage of any of the fixed contacts between the disks 116. By rotating the disks 116 a wiping action is created across the fixed contacts cleaning both the contacts and the disks as well as making electrical connection thereto.

Referring to FIG. 8, the shaft 12 made of a non-conductive material can be seen having both a round portion 144 and a square portion 146 alternating over its entire length. The shaft 12 is retained by the housings 145, 147 (FIG. 1) which hold it in a fixed position so that it is not rotatable about its axis. The shaft 12 is slidably moveable from side to side. Such movement is controlled by a handle 148. The handle 148 is connected to the shaft 12 through an opening in the housing in the end section 20. The housing 147 is axially aligned with the shaft 12. Housing 145, on end section 19, is also axially aligned with shaft 12. The internal dimensions of housing 145 match the external dimensions of the square portions 146 on shaft 12 so that the shaft 12 can be pushed toward housing 145 keeping the switch sections from rotating as more fully described hereinafter. The shaft 12 can be locked in this position by a retaining wire inserted through one or both holes 149, 150. The holes 149, 150 extend through each of the housings 145, 147 and the shaft 12 and receive a retaining wire to keep the shaft from being pulled by handle 148 outward unlocking the switch sections. The retaining wires are held in position conventionally by lead tags attached to both ends of each wire. See FIG. 1.

Figure 7:
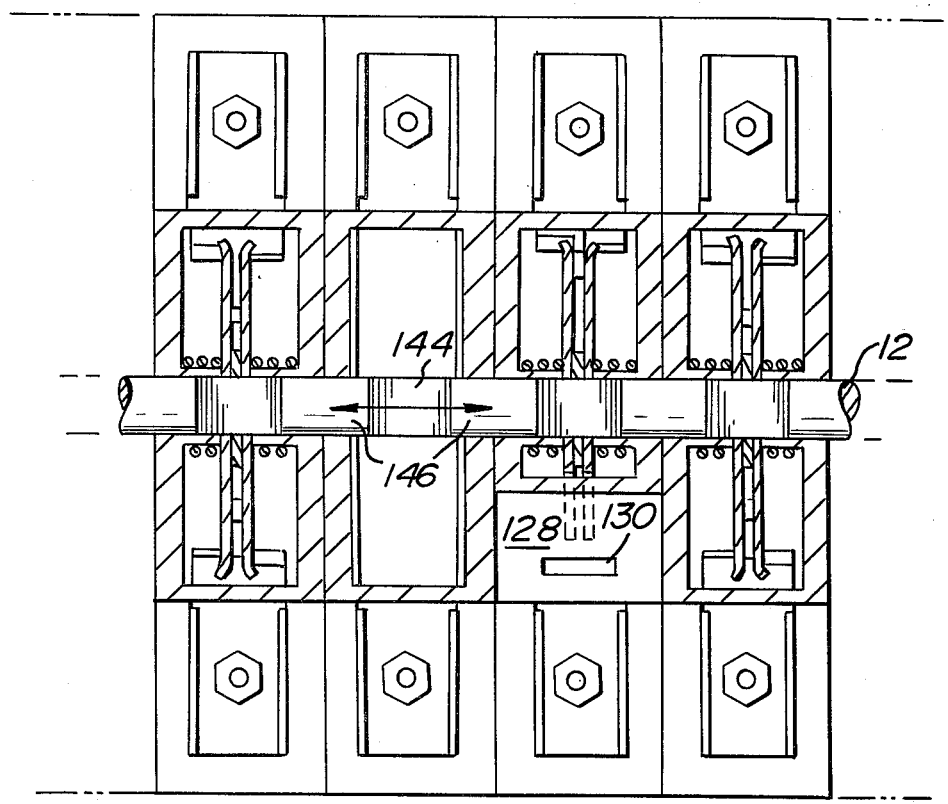
FIG. 7 is a cross-section of the test switch assembly taken along the lines 7—7 of FIG. 1.

Referring to FIG. 7, there is shown the interrelationship of each type of switch section to the common shaft 12. When the switches are in their "normal" conducting position the square center portions of each of the switches come into alignment with the square portions 146 of the shaft 12. When this occurs the shaft 12 may be slidably extended from one extreme position into the switch assembly in a sideways direction to engage each of the square center portions of each of the switches, thus locking them in the conducting position. In order for the switches to be rotated to the "test" position, the shaft 12 must be slidably moved to its other extreme position where the square center portions of each of the switches are engaged with the round portions 144 of the shaft 12. This enables the switches to be freely rotated to the "test" position. The round portions 144 of the shaft 12 are constructed so that at four points along its circumferential measurement it is tangent to the adjoining sides of the center square portions of each of the switch sections to prevent wobbling of the rotor disks.

Figure 12:
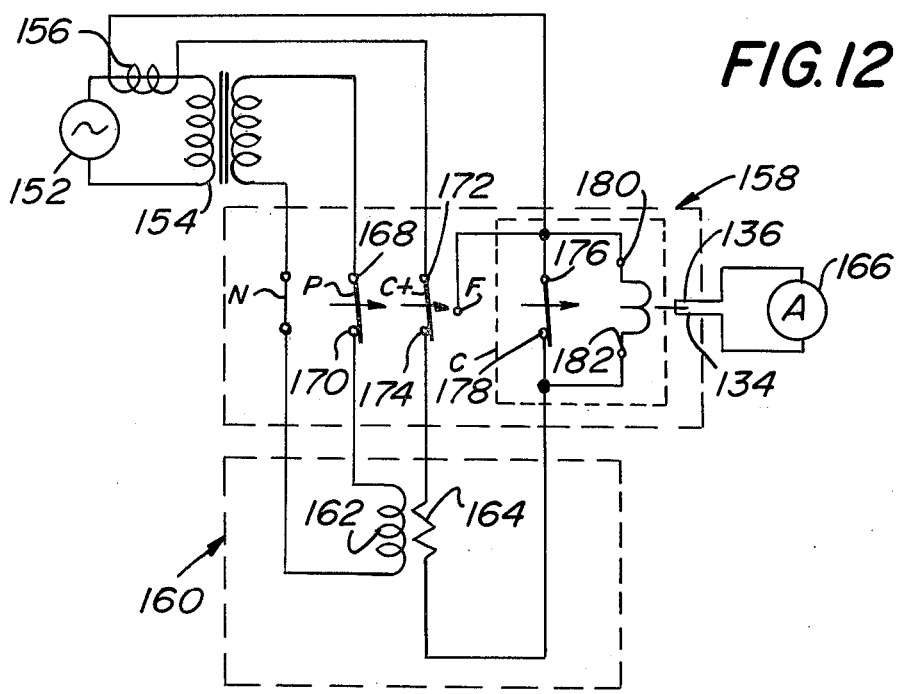
FIG. 12 is a schematic showing a set of switch connections in a single phase test circuit.

The schematic drawing of FIG. 12 shows a test switch configuration for a single phase of a kilowatthour metering circuit of a three phase power system. Such a power system is usually of a sufficiently high current and voltage that conventional watthour meters will be damaged if applied directly. A typical line source 152 would be 7200 V, 600 A. A potential transformer 154 reduces the voltage at the output of its secondary coil to 120 V. A secondary current transformer coil 156 acts in the same manner as the transformer secondary and reduces the current to 5 A. The current coil 156 is normally operated at extremely low flux densities and is usually a toroidal core having a large number of windings. At the reduced voltage and current levels a kilowatthour meter can now be connected without damage to the meter. However, in order to test the accuracy of the meter or determine whether there is damage to the input circuitry a test switch assembly 158, designated by dashed lines is inserted between the output of the transformers and the input of the meter.

Referring to FIG. 12, there is shown within the box 158 a single set of switch sections necessary to test one phase of a three phase watthour meter. The switches are shown in their "normal" conducting positions where the watthour meter 160, designated by dashed lines, measures the energy being transferred to the load. One end of the secondary coil of transformer 154 is connected to a P switch through a D contact 168. When the P switch is closed voltage will flow through another D contact 170 through the potential coil 162 of the watthour meter returning through the neutral strap N to the other end of the secondary coil of the transformer 154. The two current switches, C and C+, are connected to either side of the current coil 156. One side of the current coil 156 is connected to D contact 172 of the C+ switch. When in the normally conductive position the C+ switch will conduct current through D contact 174 to the current element 164 of the watthour meter. The other end of the current coil 156 is connected through the C switch shown in a square designated by dashed lines. The current enters the switch from the current coil 156 through D contact 176. In constant electrical connection with the D contact 176, as previously described, is the shunt F and the C contact 180. When the C switch is in its "normal" conducting position, current flows from D contact 176 to B contact 178 which is also in continuous electrical contact with the A contact 182. B contact 178 is connected to the other end of the current element 164 thus completing the current circuit.

When beginning the test procedure for testing the current flow to the watthour meter, the C+ switch is opened, disconnecting D contact 174 and connecting contact F to contact 172. This is done by rotating the rotor disks 54 of the C+ switch to the test position. In rotating the disks 54 the connection to the F contact is completed before the D-type contact 52 is isolated (D contact 172 in FIG. 12). The shunt F, being placed in the current circuit by the rotation of the C+ switch, shorts out the secondary current transformer coil 156, current being shunted through the switch rather than the watthour meter. The current test switch C can now be opened without danger to the secondary coils of the transformer. Without the shunt F, the opening of the current circuit between D contact 176 and B contact 178 of the current test switch C could saturate the core of the transformer 154 and puncture the core insulation as described above if the C contact 180 and A contact 182 were separated. Now that the current transformer coil 156 has been shorted by the shunting of the current through contact F of the current shunt switch C+, the current test switch C can be opened. The opening of the C switch enables service personnel to insert the current test probe 110 through the opening 130 in the step 128 of the C switch. Inserting the probe 110 engages it with the A contact 182 on one side and the C contact 180 on the other. The C+ switch is again rotated to its normally closed position to provide for current flow through the current element 164 of the watthour meter 160. Current now flows from the current transformer coil 156 to the current test switch C through the C contact 180 to one conductor 136 of the test probe 110 through a connected wire to one side of a test instrument such as ammeter 166. The other side of the ammeter 166 is connected through a wire to the other conductor 134 of the test probe 110 which is in contact with A contact 182 of the current test switch C. The A contact 182 now serves as the connection to one side of the current element 164 of the watthour meter. In this way an accurate measure of current flow can be made while the circuit is in operation by reading the ammeter.

To disconnect the test instrument, the test probe 110 is removed from the opening 130 causing the C contact to spring toward the A contact keeping the current path closed. As the probe 110 is withdrawn, a boot 184 at the bottom portion of the spring of the C contact contacts the facing lower portion of the A contact retaining the current flow between the A and C contacts. See FIG. 9. After the probe 110 has been removed the current test switch C is rotated to its "normal" conductive position, the shaft is returned to its locking position and the retaining wires are inserted through the holes 149, 150.

The switch sections have alternative uses. One of these uses is to calibrate the watthour meter. To accomplish this, all of the switch sections P, C and C+ are rotated to the "test" position. This procedure isolates the potential transformer coil 154 and shorts the current transformer coil 156 as described above and open ends the potential coil 162 and the current element 164 of the watthour meter. A calibrated external source is now connected to the meter to impress a voltage across neutral strap N and D contact 170. A current source is supplied across D contact 174 and B contact 178. The watthour meter can now be calibrated in accordance with the external source. When the watthour meter has been calibrated, the external source is disconnected and the switches are returned to the "normal" conducting positions.

The present invention provides for a modular type test switch assembly which can be assembled and/or disassembled on site for easy repair or replacement of one or more burned out or broken switch sections. The ease with which the switches can be disassembled also allow for rearrangement of the sections or addition of new sections to the assembly without resort to total replacement of the switch assembly. The present invention also provides a locking feature which is not based on whether the cover of the switch is on or off but rather on the positions of the switch sections when returning the test switch assembly to normal operation. In order to insert the retaining wire, the shaft must be in its locked position. The present invention also provides for the use of a pair of rotatable disks, which can be made of either conducting or nonconducting material for bridging the contacts in the switches. If a non conducting disk is used, electrically conducting facing can be applied to the disk to provide a bridge between the contacts. The disks are so designed as to make contact before contact is broken when rotated. This does not apply to the P switch which is a single pole single throw type. In addition, these disks, being in parallel electrical relation to each other, provide a very low resistance so as to comply with the meter requirements of low resistances across the switches. Finally, the present invention provides for constant protection from the environment by sealing the switches when in the "normal" conducting state.

The present invention may be embodied in other specific forms without departing from the spirit of essential attributes thereof and, accordingly, reference should be made to the appended claims rather than to the foregoing specification as indicating the scope of the invention.

I claim:

1. An electrical switch comprising:
   a pair of spaced apart plates each with a conductive portion movable between a first "normal" position and a second "test" position, said plates being provided with matching non-conductive portions;
   at least two spaced apart conductive contacts extending within a region between said plates such that each contact bridges the space between the spaced apart plates;
   said non-conductive portions and said conductive contacts being disposed in positions so that said contacts wipe against the conductive portions of said plates when said plates are disposed in said "normal" position and so that at least one of said conductive contacts is aligned with said non-conductive portions while at the same time at least another one is out of alignment when said plates are disposed in said "test" position.

2. The switch in accordance with claim 1 wherein said spaced apart plates are rotatably mounted on a shaft for angular motion between said "normal" position and said "test" position.

3. The switch in accordance with claim 2 wherein said plates are provided with an opening and wherein said shaft is slidably movable within said opening relative to said plates, said shaft having alternating first and second portions, said opening in said plates being adapted and arranged so that said plates are rotatable when engaged with a first portion of said shaft and locked when engaged with a second portion of said shaft.

4. The switch in accordance with claim 1 including a housing, said pair of plates and said at least two contacts being enclosed within said housing, and an operator accessible handle secured to said plates for controlling the motion of said plates, said handle extending through an opening in said housing and being provided with a tail to close said opening and thereby protect said plates and said contacts within said housing from the environment.

5. The switch in accordance with claim 4 wherein said housing is mountable on a base having spaced walls for receiving a plurality of said housings in side by side relationship, said housing being provided with means for frictionally engaging said base walls so that any number of said housings can be inserted in said base in any desired arrangement.

6. An electrical switch comprising:
a pair of spaced apart plates each with a conductive portion movable between a first "normal" position and a second "test" position, said plates being provided with matching cut-outs;
at least two spaced apart conductive contacts extending within a region between said plates such that each contact bridges the space between the spaced apart plates;
said cut-outs and said conductive contacts being disposed in positions so that at least a first one of said contacts engages said plates when said plates are disposed in both the "normal" and "test" positions and so that a second one of said conductive contacts engages said plates when said plates are disposed in said "normal" position and aligns with said cut-outs while at the same time the first one is out of alignment when said plates are disposed in said "test" position.

7. The switch in accordance with claim 6 wherein said spaced apart plates are rotatably mounted on a shaft for angular motion between said "normal" position and "test" position.

8. The switch in accordance with claim 7 wherein said plates are provided with an opening and wherein said shaft is slidably movable within said opening relative to said plates, said shaft having alternating round and square portions, said opening in said plates being adapted and arranged so that said plates are rotatable when aligned with a round portion of said shaft and locked when aligned with a square portion of said shaft.

9. The switch in accordance with claim 6 including a housing, said pair of plates and said at least two contacts being enclosed within said housing, and an operator accessible handle secured to said plates for controlling the motion of said plates, said handle extending through an opening in said housing and being provided with a tail to close said opening and thereby protect said plates and said contacts within said housing from the environment.

10. The switch in accordance with claim 9 wherein said housing is mountable on a base having spaced walls for receiving a plurality of housings in side by side relationship, said housing being provided with means for frictionally engaging said base walls so that any number of said housings can be inserted in said base in any desired arrangement.

11. An electrical switch comprising:
a pair of spaced apart conductive plates rotatably mounted on a shaft for angular motion between a first "normal" and a second "test" position, said plates being provided with matching cut-outs;
at least two spaced apart conductive contacts extending within a region between said plates such that each contact bridges the space between the spaced apart plates;
said cut-outs and said conductive contacts being disposed at angular positions with respect to the conductive plates so that said contacts wipe against said plates when said plates are disposed in said "normal" position, and so that at least one of said conductive contacts is aligned with said cut-outs while at the same time at least another one is out of alignment when said plates are disposed in said "test" position.

12. The switch in accordance with claim 11 wherein said plates are provided with an opening and wherein said shaft is slidably movable within said opening relative to said plates, said shaft having alternating first and second portions, said opening in said plates being adapted and arranged so that said plates are rotatable when engaged with a first portion of said shaft and locked when engaged with a second portion of said shaft.

13. The switch in accordance with claim 11 including a housing, said pair of plates and said at least two conductive contacts being enclosed within said housing, and an operator accessible handle secured to said plates for controlling the angular motion of said plates, said handle extending through an opening in said housing and being provided with a tail to close said opening and thereby protect said plates and said contacts within said housing from the environment.

14. The switch in accordance with claim 13 wherein said housing is mountable on a base having spaced walls for receiving a plurality of said housings in side by side relationship, said housing being provided with means for frictionally engaging said base walls so that any number of said housings can be inserted in said base in any desired arrangement.

15. An electrical switch comprising:
a pair of spaced apart conductive plates rotatably mounted on a shaft for angular motion between a first "normal" and a second "test" position, said plates being provided with matching cut-outs;
at least two spaced apart conductive contacts extending within a region between said plates;
at least two abutting conductive contacts, one of said abutting contacts being electrically connected to one of said spaced contacts and the other of said abutting contacts being electrically connected to the other of said spaced contacts;
a housing provided with an opening for accomodating a test probe, said opening being disposed in said housing so that said test probe can be inserted between said abutting contacts when said plates are in said "test" position only;
said opening being aligned with said abutting contacts so that said abutting contacts are spaced apart from each other when said test probe is inserted therebetween;
said cut-outs and said spaced contacts being disposed at angular positions with respect to the conductive plates so that said contacts wipe against said plates when said plates are disposed in said "normal"

position, and so that at least one of said spaced contacts is aligned with said cut-outs when said plates are disposed in said "test" position.

16. The switch in accordance with claim 15 wherein said plates are provided with an opening and wherein said shaft is slidably movable within said opening relative to said plates, said shaft having alternating first and second portions, said opeing in said plates being adapted and arranged so that said plates are rotatable when engaged with a first portion of said shaft and locked when engaged with a second portion of said shaft.

17. The switch in accordance with claim 15 including a housing, said pair of plates, said at least two spaced contacts and said at least two abutting contacts being enclosed in said housing, and an operator accessible handle secured to said plates for controlling the angular motion of said plates, said handle extending through an opening in said housing and being provided with a tail to close said opening and thereby protect said plates, said spaced contacts and said abutting contacts within said housing from the environment.

18. The switch in accordance with claim 17 wherein said housing is mountable on a base having spaced walls for receiving a plurality of said housings in side by side relationship, said housing being provided with means for frictionally engaging said base walls so that any number of said housings can be inserted in said base in any desired arrangement.

19. An electrical switch comprising:
a pair of spaced apart conductive plates rotatably mounted on a shaft for angular motion between a first "normal" and a second "test" position, said plates being provided with matching cut-outs;
at least first and second spaced apart conductive contacts extending within a region between said plates such that each contact bridges the space between the spaced apart plates;
a third conductive contact spaced apart from said first and second conductive contacts;
said cut-outs and said conductive contacts being disposed at angular positions with respect to the conductive plates so that said first and second contacts wipe against said conductive plates and said third contact is aligned with said cut-outs when said conductive plates are disposed in said "normal" position, and so that one of said first and second contacts is aligned with said cut-outs and the other of said first and second contacts and said third contact wipe against said conductive plates when said plates are disposed in said "test" position, and so that said first and second contacts and said third contact wipe against said plates when said plates are disposed between said "normal" and said "test" positions.

20. The switch in accordance with claim 19 wherein said plates are provided with an opening and wherein said shaft is slidably movable within said opening relative to said plates, said shaft having alternating round and square portions, said opening in said plates being adapted and arranged so that said plates are rotatable when aligned with a round portion of said shaft and locked when aligned with a square portion of said shaft.

21. The switch in accordance with claim 19 including a housing, said pair of plates, said at least first and second spaced contacts and said third contact being enclosed within said housing, and an operator accessible handle secured to said plates for controlling the angular motion of said plates, said handle extending through an opening in said housing and being provided with a tail to close said opening and thereby protect said plates, said at least first and second spaced contacts and said third contact within said housing from the environment.

22. The switch in accordance with claim 21 wherein said housing is mountable on a base having spaced walls for receiving a plurality of said housings in side by side relationship, said housing being provided with means for frictionally engaging said base walls so that any number of said housings can be inserted in said base in any desired arrangement.

23. An electrical switch comprising:
a pair of spaced apart conductive plates rotatably mounted on a shaft for angular motion between a first "normal" and a second "test" position, said plates being provided with matching cut-outs;
at least two spaced conductive contacts extending within a region between said plates such that each contact bridges the space between the spaced apart plates;
said cut-outs and said spaced contacts being disposed at angular positions with respect to the conductive plates so that said contacts wipe against said plates in said "normal" position and so that at least one of said spaced contacts is aligned with said cut-outs while at the same time at least another one is out of alignment when said plates are disposed in said "test" position.

24. The switch in accordance with claim 23 wherein said plates are provided with an opening and wherein said shaft is slidably movable within said opening relative to said plates, said shaft having alternating first and second portions, said opening in said plates being adapted and arranged so that said plates are rotatable when engaged with a first portion of said shaft and locked when engaged with a second portion of said shaft.

25. The switch in accordance with claim 23 including a housing, said pair of plates and said at least two conductive contacts being enclosed within said housing, and an operator accessible handle secured to said plates for controlling the angular motion of said plates, said handle extending through an opening in said housing and being provided with a tail to close said opening and thereby protect said plates and said conductive contacts within said housing from the environment.

26. The switch in accordance with claim 25 wherein said housing is mountable on a base having spaced walls for receiving a plurality of said housings in side by side relationship, said housing being provided with means for frictionally engaging said base walls so that any number of said housings can be inserted in said base in any desired arrangement.

* * * * *